United States Patent
Yu (10) Patent No.: US 8,637,898 B2
(45) Date of Patent: Jan. 28, 2014

(54) LINEAR VOLTAGE-CONTROLLED CURRENT SOURCE

(75) Inventor: Haoyang Yu, Nashua, NH (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 286 days.

(21) Appl. No.: 13/014,634

(22) Filed: Jan. 26, 2011

(65) Prior Publication Data

US 2012/0188020 A1    Jul. 26, 2012

(51) Int. Cl.
*H01L 29/66* (2006.01)

(52) U.S. Cl.
USPC .......................................................... 257/159

(58) Field of Classification Search
USPC .......................................................... 257/159
See application file for complete search history.

(56) References Cited

U.S. PATENT DOCUMENTS

| 5,604,368 | A | 2/1997 | Taur et al. |
| 6,031,413 | A | 2/2000 | Mizoguchi |
| 6,388,286 | B1 | 5/2002 | Baliga |
| 2001/0017392 | A1 | 8/2001 | Comfort et al. |
| 2004/0161886 | A1 | 8/2004 | Forbes et al. |
| 2005/0270010 | A1* | 12/2005 | Ota ............................ 323/315 |
| 2012/0188020 | A1* | 7/2012 | Yu ............................. 330/296 |

OTHER PUBLICATIONS

U.S. Appl. No. 11/933,271, entitled Current Source Circuit and Associated Method, filed Oct. 13, 2007.

* cited by examiner

*Primary Examiner* — Bradley K Smith
(74) *Attorney, Agent, or Firm* — Schwabe Williamson & Wyatt (57) ABSTRACT

Embodiments of circuits, methods and systems for a voltage-controlled current source are disclosed. In some embodiments, the voltage-controlled current source may be a three-terminal device having separated gate structures. Other embodiments may also be described and claimed.

9 Claims, 7 Drawing Sheets

LINEAR VOLTAGE-CONTROLLED CURRENT SOURCE

FIELD

Embodiments of the present disclosure relate generally to the field of current sources, and more particularly to linear voltage-controlled current sources.

BACKGROUND

In semiconductor integrated circuits, a current source provides a reference current in order to design transistor bias networks that are insensitive to supply voltage, temperature, and process variations. If the current through a current source can be specified independently of any other variable in a circuit, it is called an independent current source. Conversely, if the current through a current source is determined by some other voltage in a circuit, it is called a voltage-controlled current source (VCCS).

In most applications, it is desirable to have a linear relationship between the current and the control voltage. However, stand-alone conventional devices do not function as linear VCCSs. For example, in a bipolar junction transistor (BJT) device, the collector current is an exponential function of the base voltage, while in a field-effect transistor (FET) device, the drain current is a power function of the gate voltage. In both cases, the current is a strong function of the control voltage, which makes it unsuitable for linear applications.

Conventionally, complicated circuits using operational amplifiers are required to make a linear VCCS. Such circuits consume extra direct-current (DC) power and are typically large in size.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in various embodiments" is used repeatedly. The phrase generally does not refer to the same embodiments; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C), or (A, B and C).

As used herein, "coupled with" may mean either one or both of the following: a direct coupling or connection, where there is no other element coupled or connected between the elements that are said to be coupled with each other; or an indirect coupling or connection, where one or more other elements are coupled or connected between the elements that are said to be coupled with each other.

Figure 1:
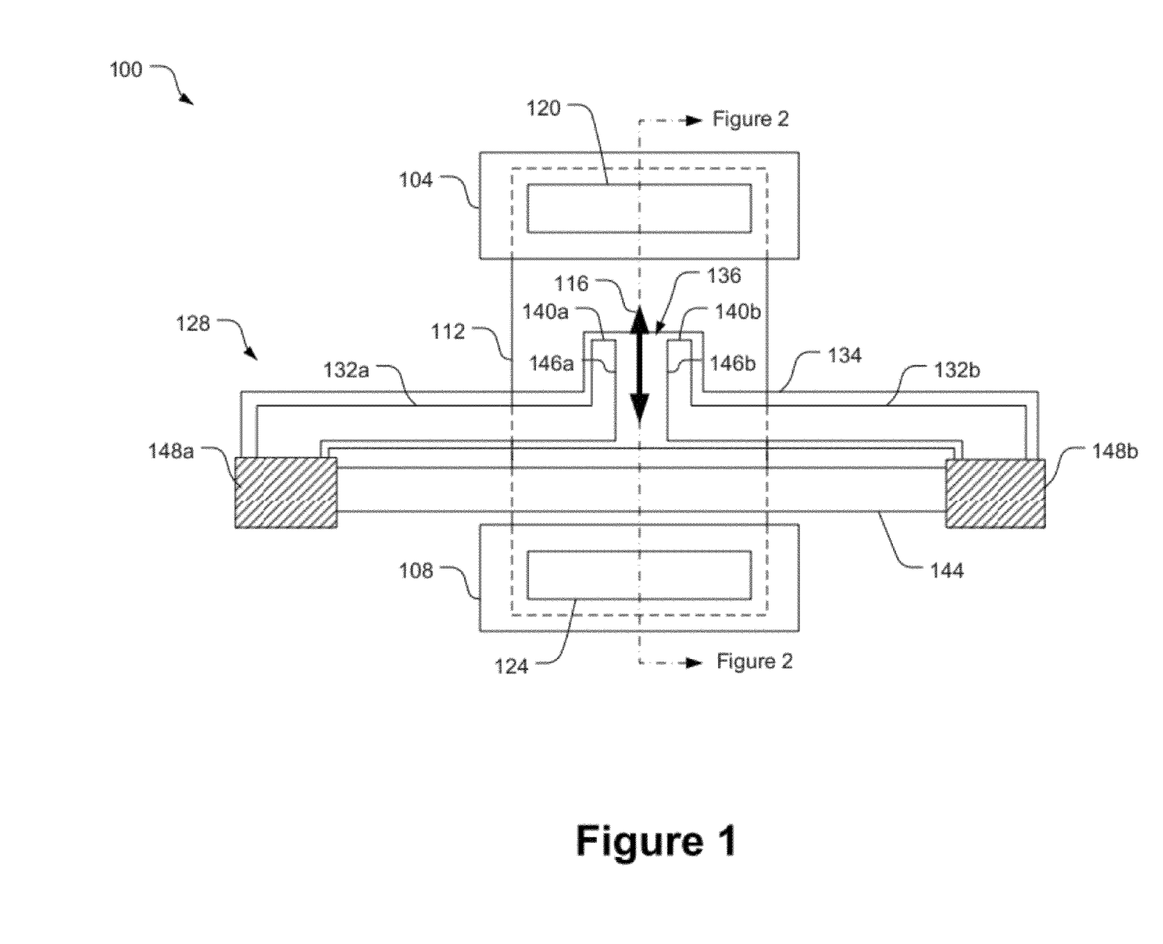
FIGS. 1 and 2 respectively illustrate a top view and a cross-sectional side view of a voltage-controlled current source (VCCS) in accordance with an embodiment.
Figure 2:
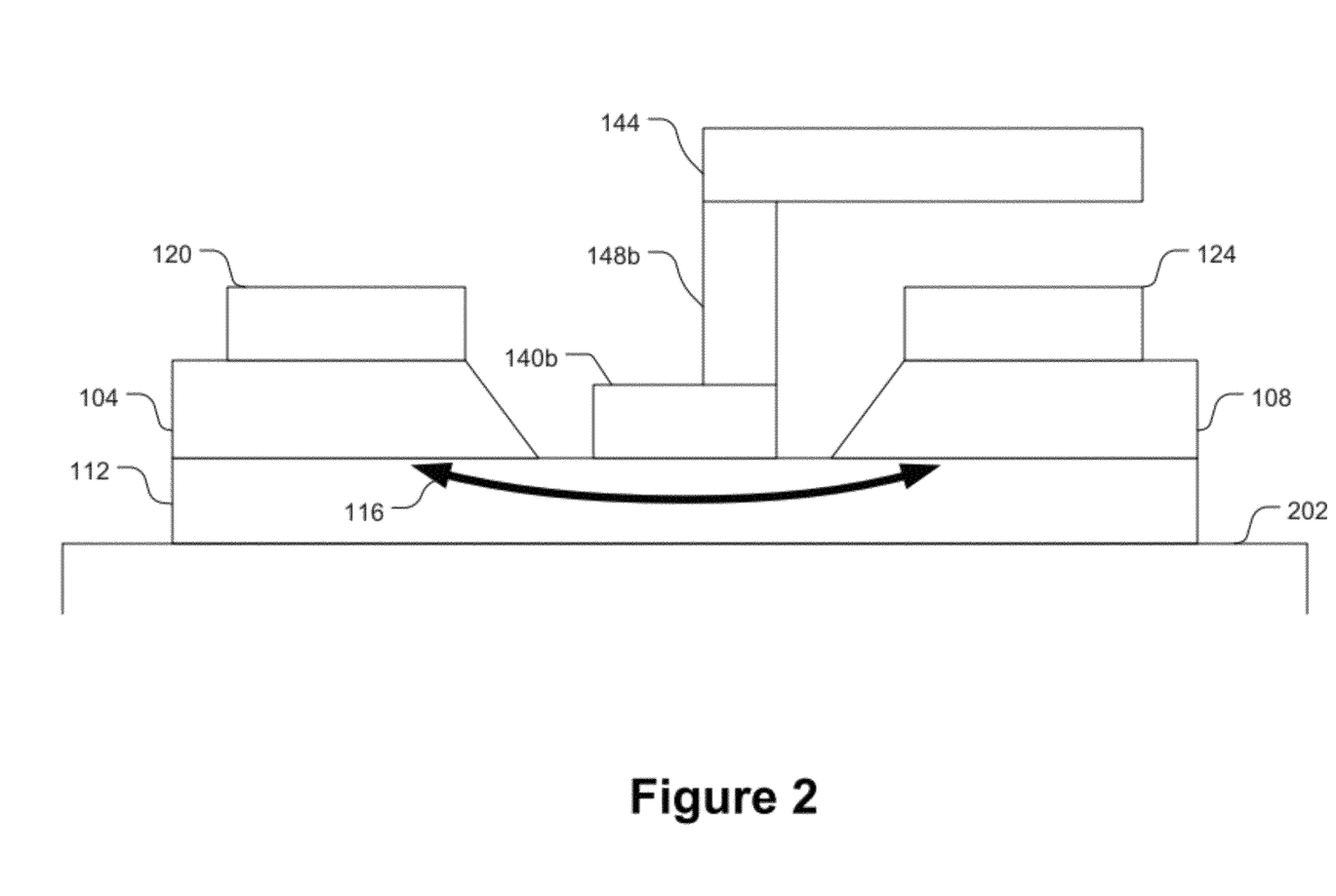

FIGS. 1 and 2 respectively illustrate a top view and a cross-sectional side view of a voltage-controlled current source (VCCS) 100 in accordance with an embodiment. The VCCS 100 may be a field-effect transistor (FET) having a drain 104 and a source 108 coupled with a channel 112 that is formed over a semi-insulating substrate 202 (shown in FIG. 2). The semi-insulating substrate 202 may be composed of, e.g., gallium arsenide (GaAs), silicon (Si), silicon germanium (SiGe), germanium (Ge), indium phosphide (InP), gallium nitride (GaN), aluminum gallium arsenide (AlGaAs), indium gallium arsenide (InGaAs), etc.

While embodiments of the disclosure are described with reference to a general FET device, various embodiments may be practiced with respect to any of a variety of FET devices. Such devices may include transistors such as, but not limited to, metal semiconductor field-effect transistors (MESFETs), pseudomorphic high electron mobility transistors (pHEMTs), junction field-effect transistors (jFETs), metal insulator semiconductor field-effect transistors (MISFETs), modulation doped field-effect transistors (MODFETs), bipolar field-effect transistors (BiFETs), bipolar high electron mobility transistor (BiHEMTs), or any other suitable compound semiconductor FET technology. In addition or as an alternative, the VCCS 100 may be formed with a complementary metal oxide semiconductor (CMOS) technology.

The channel 112 may be an isolation implant channel that operates as an active semiconductor area through which current may flow. The current may flow between the drain 104 and the source 108 as shown by arrow 116.

The drain 104 may include a drain terminal 120 configured to be coupled with other components of a circuit into which the VCCS 100 is integrated. Similarly, the source 108 may include a source terminal 124 configured to be coupled with other components of the circuit into which the VCCS 100 is integrated. The drain terminal 120 and the source terminal 124 may be considered ohmic contacts that are characterized by linear and symmetric characteristics of a current-voltage (I-V) curve across the contact interface.

The VCCS 100 may also include a gate 128 having separated gate structures 132, including a first gate structure 132a and a second gate structure 132b. In some embodiments, the gate structures 132 may be surrounded by a wide recess 134 to enhance the breakdown voltage. At least a portion of the separated gate structures 132, hereinafter also referred to as "gate structures 132," may be adjacent to and, in some cases, coupled with the channel 112. The gate structures 132 may be disposed relative to one another in a manner to define a gap region 136 between tips 140, including a first tip 140a and a second tip 140b, of the gate structures 132. While FIG. 1 shows a particular geometrical configuration of the gate structures 132 (and tips 140) and the gap region 136, other embodiments may have other configurations that operate in a manner similar to the manner described with respect to VCCS 100.

Each of the gate structures 132 may be coupled with a gate terminal 144 through vias 148a and 148b. The gate structures 132, the gate terminal 144, and the vias 148 may be composed of a conductive material, e.g., gold, to provide a conductive path from the gate terminal 144 to the tips 140. The coupling arrangement of the components of the gate 128 may be seen with reference to the cross-sectional side view of the VCCS 100 shown in FIG. 2.

The gate terminal 144 may be coupled with other components of a circuit into which the VCCS 100 is integrated. In particular, the gate terminal 144 may be configured to receive a control voltage, to control the current flow between the drain 104 and the source 108 through the channel 112. The current flowing through the channel 112 may predominantly flow through the gap region 136; however, at least some current may flow along the gap-side edges 146, including gap-side edge 146a and 146b, of the tips 140. The current flowing through the gap region 136 may be predominately determined by the geometrical properties of the gap region 136 and the implantation properties of the channel 112, while the current along the gap-side edges 146 may be determined by the control voltage, in addition to the geometrical properties of the gap region 136 and the implantation properties of the channel 112. The relationship between the control voltage and the current may be a linear relationship, as will be shown below.

In some embodiments, the gate 128 may be biased below a pinch-off (or threshold) voltage, to restrict current flow through the gap region 136 and along the gap-side edges 146.

Figure 3:
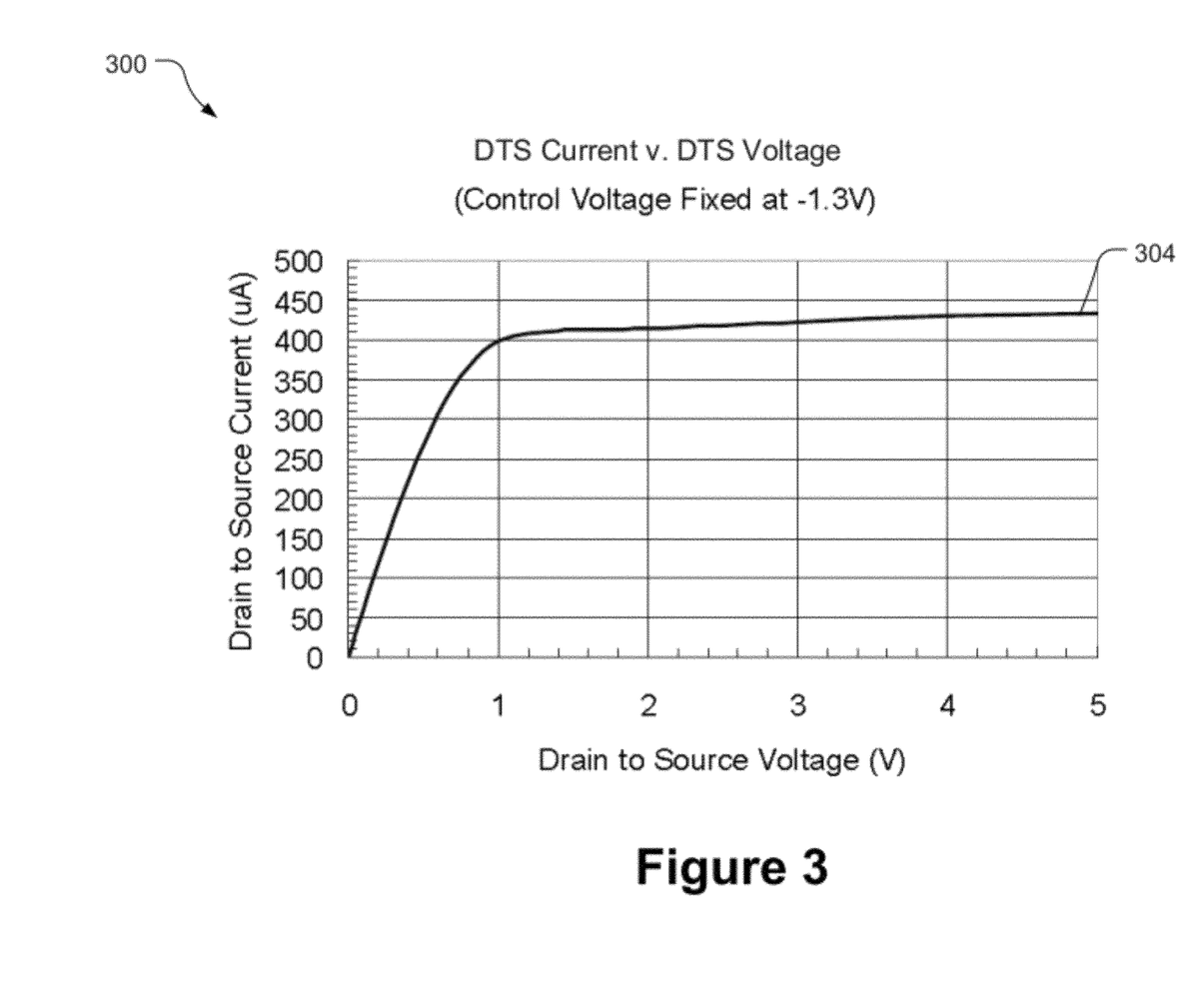
FIG. 3 is a chart that plots drain-to-source (DTS) current as a function of DTS voltage in a VCCS of an embodiment.

FIG. 3 is a chart 300 that plots drain-to-source (DTS) current as a function of DTS voltage in the VCCS 100 in accordance with an embodiment. In this embodiment, the control voltage may be fixed at −1.3 volts (V). Line 304 of chart 300 shows that DTS current increases rapidly from 0 to approximately 400 microamps (uA) over a first range of DTS voltage values, e.g., 0 to 1 V. However, after a certain DTS voltage, referred to as the knee voltage, the DTS current is substantially independent of the DTS voltage. The knee voltage is shown to be approximately 1 V in chart 300. Thus, as can be seen, the DTS current through the VCCS 100 is substantially independent of the DTS voltage over a significant range of the DTS voltage. Therefore, the VCCS 100 shows desirable current-source characteristics.

Figure 4:
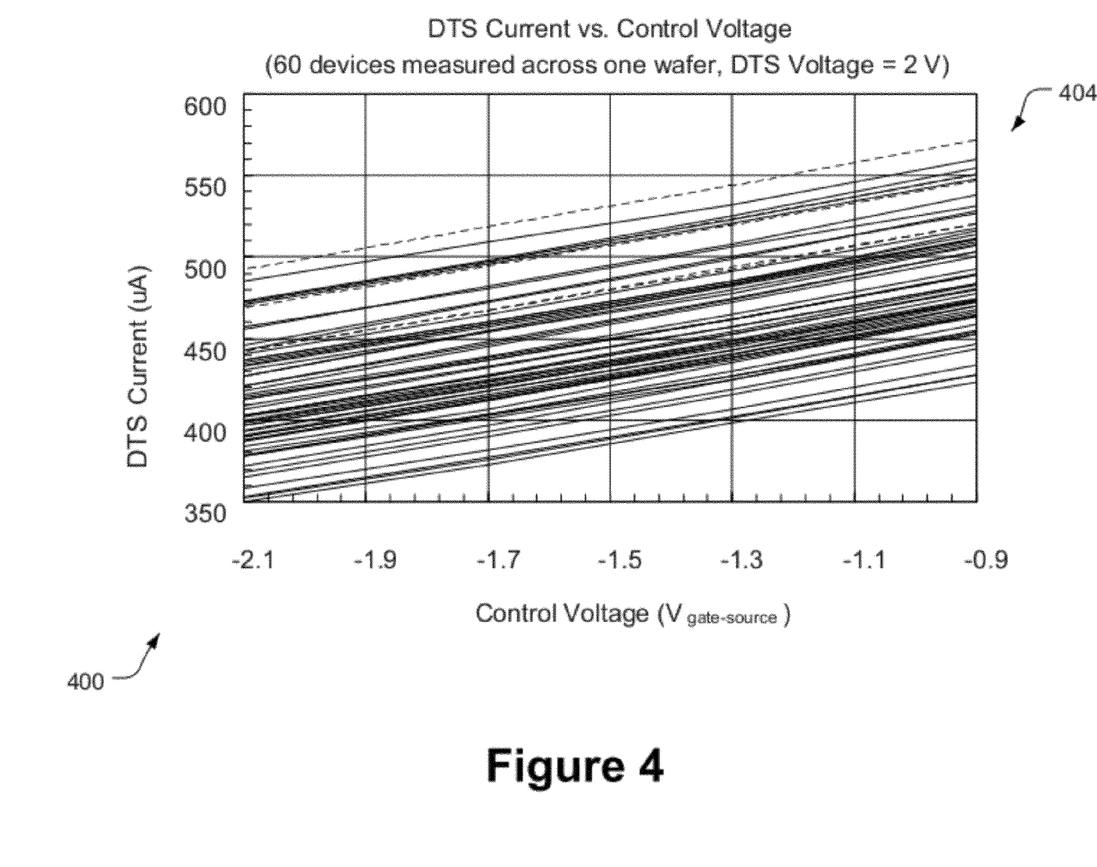
FIG. 4 is a chart that plots DTS current as a function of control voltage for a number of VCCSs of an embodiment.

FIG. 4 is a chart 400 that plots DTS current as a function of control voltage in accordance with some embodiments. Chart 400 shows lines 404 that correspond to measurements from 60 VCCS devices, having the same structure as VCCS 100, across one wafer with a DTS voltage fixed at 2 V. The absolute value of the DTS current across the 60 devices may have a standard deviation that is approximately 7%, which may be similar to conventional gap-current sources. However, the slope of the lines barely change. Therefore, chart 400 also shows that current through VCCSs of embodiments of this disclosure, e.g., VCCS 100, are controlled by the voltage in a desirable manner.

Figure 5:
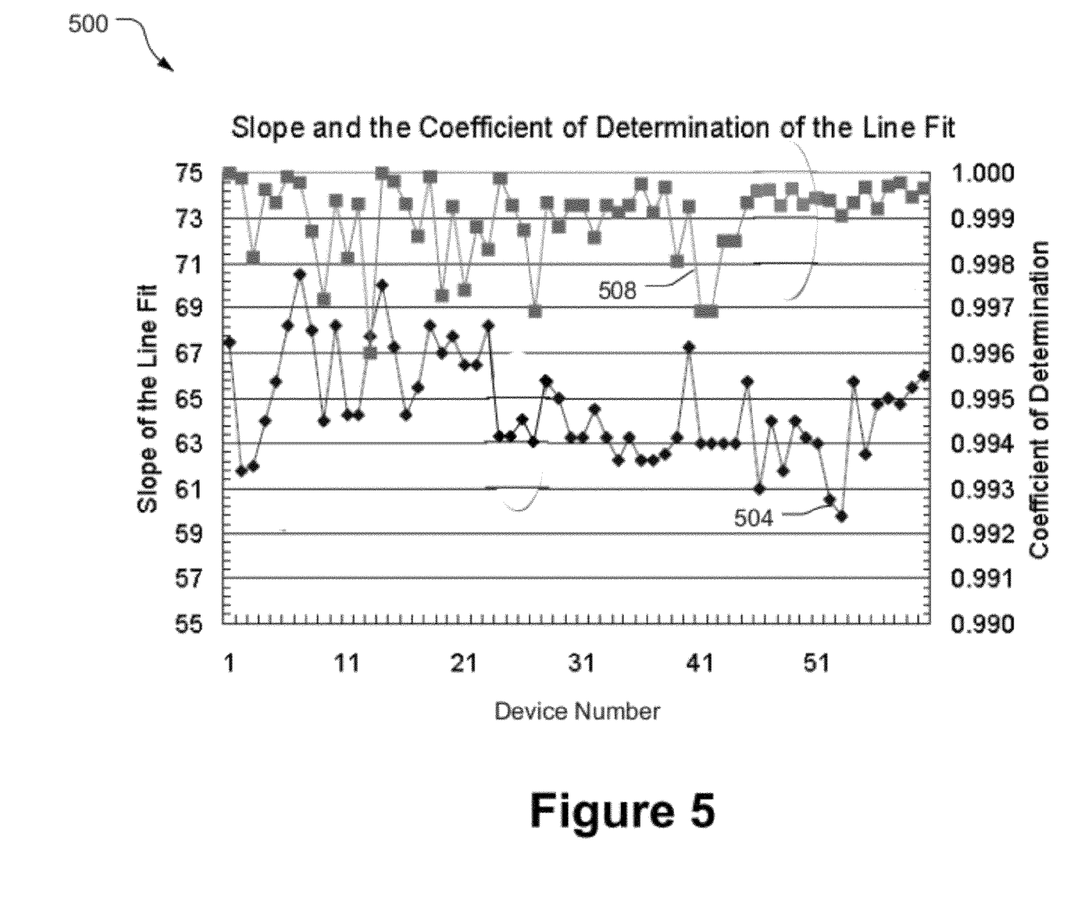
FIG. 5 is a chart that presents statistical analyses of the data of FIG. 4 in accordance with an embodiment.

FIG. 5 is a chart 500 that presents statistical analyses of the lines 404 in accordance with some embodiments. In particular, line 504 represents the slopes of the lines 404, by reference to the left side of chart 500, and line 508 represents coefficients of determination, $R^2$, by reference to the right side of the chart 500. Each of the measurements of lines 504 and 508, determined by using a least squares method, shows characteristics of a straight line that best fits the data presented in chart 400. The coefficients of determination of measurements of line 508 are close to 1 and thereby indicate a desirable linear fit. The slopes of measurements of line 504 range from about 60 to 70, which is less than 3% standard deviation, and thereby indicate a very small process variation. Thus, chart 500 shows that the VCCS 100 may be considered a linear VCCS 100 in which the control voltage controls the DTS current in a desired linear manner.

Figure 6:
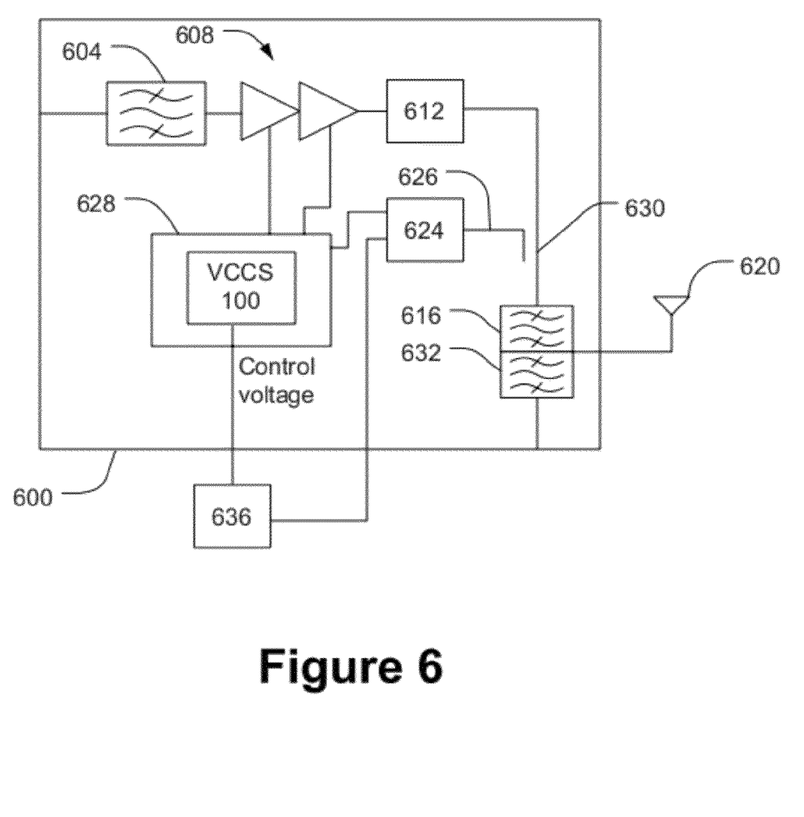
FIG. 6 is a power amplifier duplexer incorporating a VCCS in accordance with an embodiment.

The VCCS 100 may be incorporated into any of a variety of apparatuses and systems. A block diagram of a module 600 incorporating VCCS 100 is shown in FIG. 6 in accordance with an embodiment. The module 600 may be, for example, a power amplifier (PA) duplexer module. The module 600 may include a filter 604 configured to receive and filter a transmit radio-frequency (RF) signal. The filter 604 may provide the filtered transmit RF signal to power amplification circuitry 608, including one or more power amplifiers, for amplification. A match circuit 612 may be coupled with the power amplification circuitry 608 to match a source impedance to a load impedance to facilitate efficient amplification of the transmit RF signal. The amplified transmit RF signal may be filtered by filter 616 and transmitted over the air by antenna 620.

The module may include a power detector 624 that is coupled with a bias controller 628 and/or controller 636. The power detector 624 may be configured to obtain RF power measurements associated with the amplified transmit RF signal that is provided to filter 616. The power detector 624 may obtain the RF power measurements by having line 626 adjacent to, but not connected with, line 630.

The antenna 620 may also receive RF signals over the air and couple the received RF signals to filter 632. The filter 632 may filter and output the received RF signals.

The bias controller 628 may include the VCCS 100. The bias controller 628 may use the DTS current through the VCCS 100 as a reference current to set a DC bias current of the power amplification circuitry 608 and also the power detector 624. The DTS current through the VCCS 100 may be based on a received control voltage, which may be a voltage bias adjust (VBA) signal. The control voltage may be received from the controller 636, which is either external or internal to the module 600. The controller 636 may generate the control voltage based on, e.g., feedback measurements such as temperature, pinch-off voltage compensation, RF power measurements, etc. The controller 636 may receive the feedback measurements as a detector voltage, VDET, from the power detector 624; as an internal measurement of the bias controller 628, e.g., from a tap point of a current mirror circuit within the bias controller 628; etc.

In some embodiments, the controller 636 may operate as an open loop control system. For example, the temperature and pinch-off voltage of the entire GaAs chip may be fairly uniform. Therefore, the controller 636 could be a stand-alone circuit, e.g., a gate-source diode with a drain that is either floating or connected to gate. The voltage across the gate-source diode may track the pinch-off voltage and may, therefore, serve as a basis for generating the control voltage in an embodiment.

The VCCS 100 may not draw current from the controlling circuit, e.g., controller 636, through the gate terminal 144. Therefore, embodiments of this disclosure provide the flexibility of a linear VCCS without disturbing or otherwise negatively affecting operation of a controlling circuit.

Figure 7:
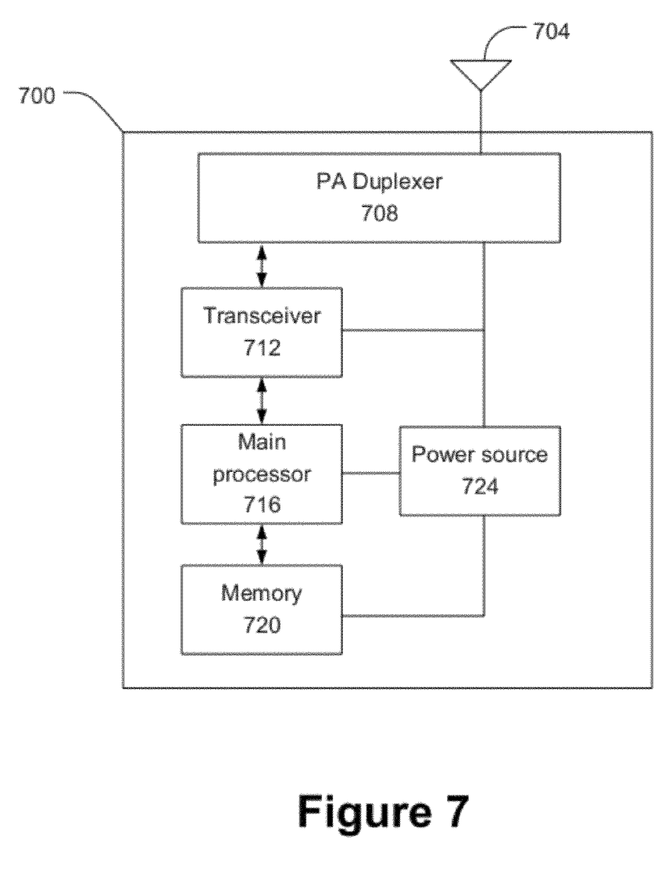
FIG. 7 is a wireless communication device incorporating a power amplifier duplexer in accordance with an embodiment.

FIG. 7 illustrates a wireless communication device 700 in accordance with an embodiment. The wireless communication device 700 may have an antenna 704 and a PA duplexer 708 that is similar to module 600 described above. The wireless communication device 700 may further include a transceiver 712, a main processor 716, and a memory 720 coupled with each other at least as shown. The wireless communication device 700 may also include a power source 724 coupled with the electrical components of the wireless communication device 700 in accordance with known electrical principles. While the wireless communication device 700 is shown with transmitting and receiving capabilities, other embodiments may include devices with only transmitting or only receiving capabilities.

In various embodiments, the wireless communication device 700 may be, but is not limited to, a mobile computing device (e.g., a mobile telephone, a smartphone, a paging device, a personal digital assistant, a text-messaging device, etc.), a portable computing device (e.g., a laptop computing device, a tablet computing device, etc.), a desktop computing device, a base station, a subscriber station, an access point, a radar, a satellite communication device, or any other device capable of wirelessly transmitting/receiving RF signals.

The main processor 716 may execute a basic operating system program, stored in the memory 720, in order to control the overall operation of the wireless communication device 700. For example, the main processor 716 may control the reception of signals and the transmission of signals by transceiver 712. The main processor 716 may be capable of executing other processes and programs resident in the memory 720 and may move data into or out of memory 720, as desired by an executing process.

The transceiver 712 may receive outgoing data (e.g., voice data, web data, e-mail, signaling data, etc.) from the main processor 716, may generate the transmit RF signal(s) to represent the outgoing data, and provide the transmit RF signal(s) to the PA duplexer 708. In some embodiments, the transceiver 712 may also include a controller, similar to controller 636, to generate a control voltage for a VCCS included in a bias controller of the PA duplexer 708 as described above with respect to module 600.

The PA duplexer 708 may filter, amplify and transmit the transmit RF signal(s) over the air via the antenna 704 as described above with respect to module 600.

In a manner similar, but converse, to the transmitting operations, the transceiver 712 may receive an RF signal from the antenna 704 through the PA duplexer 708. The transceiver 712 may process and send the receive RF signal to the main processor 716 for further processing.

In various embodiments, the antenna 704 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 700 is given by way of example and that, for simplicity and clarity, only so much of the construction and operation of the wireless communication device 700 as is necessary for an understanding of the embodiments is shown and described. Various embodiments contemplate any suitable component or combination of components performing any suitable tasks in association with wireless communication device 700, according to particular needs. Moreover, it is understood that the wireless communication device 700 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising a voltage-controlled current source that includes:
a channel;
a drain coupled with the channel;
a source coupled with the channel; and
a gate having:
a first gate structure adjacent to the channel;
a second gate structure adjacent to the channel and disposed with respect to the first gate structure to provide a gap region between the first gate structure and second gate structure; and
a terminal coupled with the first gate structure and the second gate structure and configured to receive a control voltage to control current flow between the source and the drain through the channel,
wherein the control voltage has a substantially linear relationship with the current flow.

2. The circuit of claim 1, wherein the gate further comprises:
a first via to couple the first gate structure with the terminal; and
a second via to couple the second gate structure with the terminal.

3. The circuit of claim 1, wherein the channel comprises an isolation implant channel.

4. The circuit of claim 1, wherein the circuit further comprises a bias controller configured to bias a power amplifier based on the current.

5. The circuit of claim 4, wherein the bias controller is configured to receive a voltage bias adjust signal as the control signal.

6. The circuit of claim 4, further comprising:
a controller coupled with the bias controller and configured to provide the control signal based on operating characteristics of the power amplifier.

7. The circuit of claim 6, wherein the operating characteristics include temperature, pinch-off voltage, or radio-frequency power.

8. The circuit of claim 1, wherein the circuit comprises a field-effect transistor.

9. The circuit of claim 1, wherein the circuit comprises a bipolar-high electron mobility transistor (BiHEMT) or a pseudomorphic high electron mobility transistor (pHEMT).

* * * * *